US 10,412,835 B2

(12) United States Patent
Huang

(10) Patent No.: US 10,412,835 B2
(45) Date of Patent: Sep. 10, 2019

(54) PACKAGE SUBSTRATE

(71) Applicants:Qi Ding Technology Qinhuangdao Co., Ltd., Qinhuangdao (CN); Zhen Ding Technology Co., Ltd., Tayuan, Taoyuan (TW)

(72) Inventor: Yu-Cheng Huang, New Taipei (TW)

(73) Assignees: Qi Ding Technology Qinhuangdao Co., Ltd., Qinhuangdao (CN); Zhen Ding Technology Co., Ltd., Tayuan, Yaoyuan (TW)

( * ) Notice: Subject to any disclaimer, the term of this patent is extended or adjusted under 35 U.S.C. 154(b) by 0 days.

(21) Appl. No.: 15/953,560

(22) Filed: Apr. 16, 2018

(65) Prior Publication Data

US 2018/0235085 A1  Aug. 16, 2018

Related U.S. Application Data

(62) Division of application No. 14/967,907, filed on Dec. 14, 2015, now Pat. No. 9,992,873.

(30) Foreign Application Priority Data

Oct. 29, 2015  (CN) .......................... 2015 1 0726669

(51) Int. Cl.
*H01R 9/00* (2006.01)
*H05K 1/18* (2006.01)
(Continued)

(52) U.S. Cl.
CPC ........... *H05K 1/181* (2013.01); *H05K 1/0298* (2013.01); *H05K 3/0038* (2013.01);
(Continued)

(58) Field of Classification Search
CPC ................ H05K 1/0298; H05K 1/181; H05K 2203/025; H05K 3/0038; H05K 3/0058;
(Continued)

(56) References Cited

U.S. PATENT DOCUMENTS 6,035,527 A * 3/2000 Tamm .................... H05K 3/027
                                                        205/126
7,297,562 B1 * 11/2007 Huemoeller ........ H01L 21/4857
                                                        438/15
(Continued)

FOREIGN PATENT DOCUMENTS

CN  101593705 A  12/2009
CN  103915421 A  7/2014

*Primary Examiner* — Yuriy Semenenko
(74) *Attorney, Agent, or Firm* — ScienBiziP, P.C.

(57) ABSTRACT

A package substrate includes a dielectric layer, a first circuit layer, a second circuit layer and at least one electrically conductive pole. The dielectric layer includes a first side and a second side opposite to the first side. The first circuit layer is located at the first side of the dielectric layer, and includes a plurality of spaced first circuit patterns embedded into the dielectric layer. The second circuit layer is located at the second side of the dielectric layer, and includes a plurality of spaced second circuit patterns located on the second side the dielectric layer. The electrically conductive pole electrically couples the first circuit layer to the second circuit layer. Each of the first circuit patterns has an extension direction from the first side toward the second side, and has widths gradually decreasing along the extension direction.

10 Claims, 11 Drawing Sheets

(51) Int. Cl.
*H05K 1/02* (2006.01)
*H05K 3/00* (2006.01)
*H05K 3/30* (2006.01)
*H05K 3/46* (2006.01)
*H05K 3/04* (2006.01)
*H05K 3/20* (2006.01)
*H05K 3/06* (2006.01)

(52) U.S. Cl.
CPC ........... *H05K 3/0058* (2013.01); *H05K 3/045* (2013.01); *H05K 3/20* (2013.01); *H05K 3/303* (2013.01); *H05K 3/46* (2013.01); *H05K 3/007* (2013.01); *H05K 3/06* (2013.01); *H05K 2203/025* (2013.01)

(58) Field of Classification Search
CPC .......... H05K 3/007; H05K 3/045; H05K 3/06; H05K 3/20; H05K 3/303; H05K 3/46
See application file for complete search history.

(56) References Cited

U.S. PATENT DOCUMENTS

| | | | | |
|---|---|---|---|---|
| 7,632,753 | B1* | 12/2009 | Rusli | H01L 21/76804 257/698 |
| 8,604,359 | B2* | 12/2013 | Chen | H05K 3/4694 174/260 |
| 2002/0172021 | A1* | 11/2002 | Seri | H01L 23/49894 361/760 |
| 2008/0043447 | A1* | 2/2008 | Huemoeller | H01L 21/486 361/748 |
| 2008/0052905 | A1* | 3/2008 | Watanabe | H05K 3/0014 29/846 |
| 2014/0084475 | A1* | 3/2014 | Chen | H01L 23/3128 257/773 |
| 2016/0315041 | A1* | 10/2016 | Yen | H01L 23/49838 |

* cited by examiner

PACKAGE SUBSTRATE

CROSS-REFERENCE TO RELATED APPLICATIONS

This is a divisional application of patent application Ser. No. 14/467,907, filed on Dec. 14, 2015, as to the same assignee, which is based on and claims priority to China Patent Application No. 201510726669.3 filed on Oct. 29, 2015, the contents of which are incorporated by reference herein.

FIELD

The subject matter herein generally relates to package substrate technology, and particularly to a package substrate and a method for manufacturing the package substrate.

BACKGROUND

In the current technology, methods for manufacturing circuits of circuit boards can be divided into two types: dry film etching process and semi-additive process. The dry film etching process is a method using ways a tents as shielding for manufacturing the circuit line. The circuit board uses dry films as protecting covers on through holes of the circuit board, to prevent etching solution from entering into the through holes and etching away copper on inner wall of the through hole. In recent years, a method directly using photoresist to protect copper face to do direct etching, without circuit electroplating, is generally called as tenting. The semi-additive process is an additive process including chemical deposition of metal on a face of an insulating base, electroplating and/or etching to from conductive pattern. A process of the semi-additive process includes: drilling hole, catalytic treatment and viscous treatment, chemical copper plating, imaging (electroplating resist), graphical electroplating copper (negative phase), remove of the resist, and differential etching.

The dry film etching process generally is a first choice for manufacturing the circuit lines, because of the short process and low cost thereof, but because of the trapezoidal cross-section and the thickness of the copper layer and uniformity, the circuit line less than 35/35 µm is difficult to be manufactured by this method. At present, it can match with two fluids to etch to manufacture the circuit line of 25/25 µm, but it has higher requirements to the thickness of the copper layer and the uniformity. In addition, because of adjustment of the uniformity (or variation of the thickness of the copper layer), the process for manufacturing a fine circuit line is prone to over etch to result in the circuit line too thin or broken (as shown by a circled part A in FIG. 1), while no etch is prone to result in micro-short (as shown by a circled part B its FIG. 1), it is very difficult to repair after manufacture, which causes low yield.

BRIEF DESCRIPTION OF THE DRAWINGS

Implementations of the present technology will now be described, by way of example only, with reference to the attached figures.

DETAILED DESCRIPTION

Figure 1:
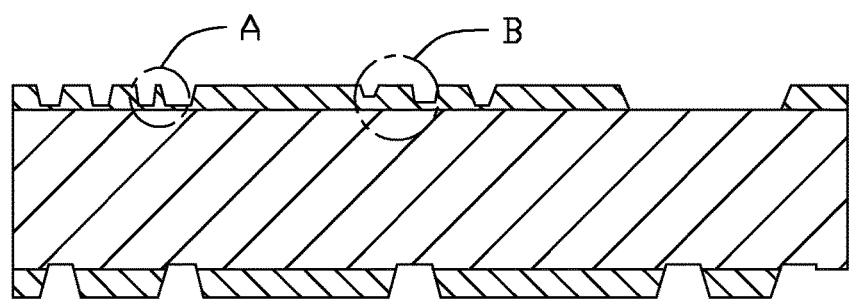
FIG. 1 is a cross sectional view of a circuit manufactured by a conventional circuit manufacturing method.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The present disclosure is described in relation to a package substrate. The package substrate can include a dielectric layer, a first circuit layer, a second circuit layer and at least an electrically conductive pole. The dielectric layer includes a first side and a second side opposite to the first side. The first circuit layer is located at the first side of the dielectric layer, and includes a plurality of spaced first circuit patterns embedded into the dielectric layer. The second circuit layer is located at the second side of the dielectric layer, and includes a plurality of spaced second circuit patterns located outsides the dielectric layer. The electrically conductive pole electrically couples the first circuit layer to the second circuit layer. Each of the first circuit patterns has an extension direction from the first side toward the second side of the dielectric layer, and has widths thereof gradually decreasing along the extension direction.

The present disclosure is described further in relation to a method for manufacturing a package substrate. The method can include the following components. A first copper layer is provided and includes a first face and a second face opposite to the first face. The first copper layer is etched from the first face to form a plurality of protrusions. A dielectric layer is laminated on the protrusions of the first copper layer. The dielectric layer comprises a first side and a second side opposite to the first side. A double copper layer structure is formed on the dielectric layer and opposite to the first copper layer. The second face of the first cooper layer is polished to change a height of each of the protrusions to form a plurality of spaced first circuit patterns embedded into the dielectric layer. The first circuit patterns collectively form a first circuit layer. The double copper layer structure is etched to form a plurality of spaced second circuit patterns. The second circuit patterns are located outsides the dielectric layer and collectively form a second circuit layer. Each of the first circuit patterns has an extension direction from the first side toward the second side of the dielectric layer, and has widths thereof gradually decreasing along the extension direction.

Figure 2:
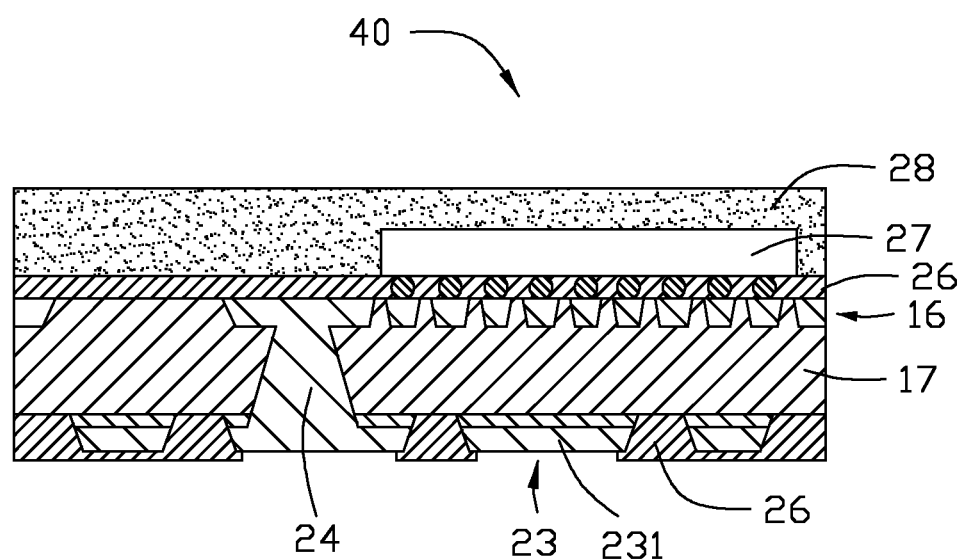
FIG. 2 is a cross sectional view of a package substrate in accordance with an embodiment of the present disclosure.

FIG. 2 illustrates a package substrate 40 of an embodiment of the present disclosure. The package substrate 40 can include a dielectric layer 17, a first circuit layer 16, a second circuit layer 23, an electrically conductive pole 24, two solder resist films 26, a chip 27 and a molding compound layer 28.

The first circuit layer 16 and the second circuit layer 23 are respectively located at two opposite sides of the dielectric layer 17. The dielectric layer 17 includes a first side and a second side opposite to the first side. The first circuit layer 16 is located at the first side of the dielectric layer 17. The second circuit layer 23 is located at the second side of the dielectric layer 17.

The first circuit layer 16 can include a plurality of first circuit patterns 15. The first circuit patterns 15 are, for example, entirely embedded inside the dielectric layer 17. Each of the first circuit patterns 15 has an extension direction from the first side toward the second side of the dielectric layer 17. Each of the first circuit patterns 15 has widths thereof gradually decreasing along the extension direction. Each of the first circuit patterns 15 can have a cross section of trapezoid.

The second circuit layer 23 can include a plurality of second circuit patterns 231 extending away from the dielectric layer 17. Each of the second circuit patterns 231 can have a cross section of trapezoid or rectangle. In the illustrated embodiment, each of the second circuit patterns 231 has the cross section of trapezoid. The second circuit patterns 231 are located on a surface of the second side of the dielectric layer 17. The second circuit layer 23 is a double copper layer structure.

The electrically conductive pole 24 is received in the dielectric layer 17. The electrically conductive pole 24 electrically couples the first circuit layer 16 to the second circuit layer 23. The electrically conductive pole 24 has a first end face in direct contact with the first circuit layer 16, and a second end face in direct contact with the second circuit layer 23.

The two solder resist films 26 cover portions of outer faces of the first circuit layer 16 and the second circuit layer 23, respectively. In at least one alternative embodiment, the two solder resist films 26 are an integral one.

The solder resist film 26 on the outer face of the first circuit layer 16 defines a plurality of openings. In at least one embodiment, the openings are corresponding to the circuit patterns 15 of the first circuit layer 16 one-to-one.

The solder resist film 26 covers portions of the outer face of the second circuit layer 23 and is filled in gaps between the second circuit patterns 231. Some of the second circuit patterns 231 are exposed out of the corresponding solder resist film 26, for being connecting to solder balls.

The chip 27 is electrically connecting to the first circuit layer 16 via solder balls. In at least one embodiment, the chip 27 is electrically connecting to bottom faces of the first circuit patterns 15 of the first circuit layer 16 via the solder balls. The solder balls are connecting to a bottom the of the chip 27. The solder balls are corresponding to and received the openings of the solder resist layer 26.

The molding compound layer 28 covers the solder resist layer 26 on the first circuit layer 16 and surrounds the chip 27 on die first circuit layer 16.

Figure 3:
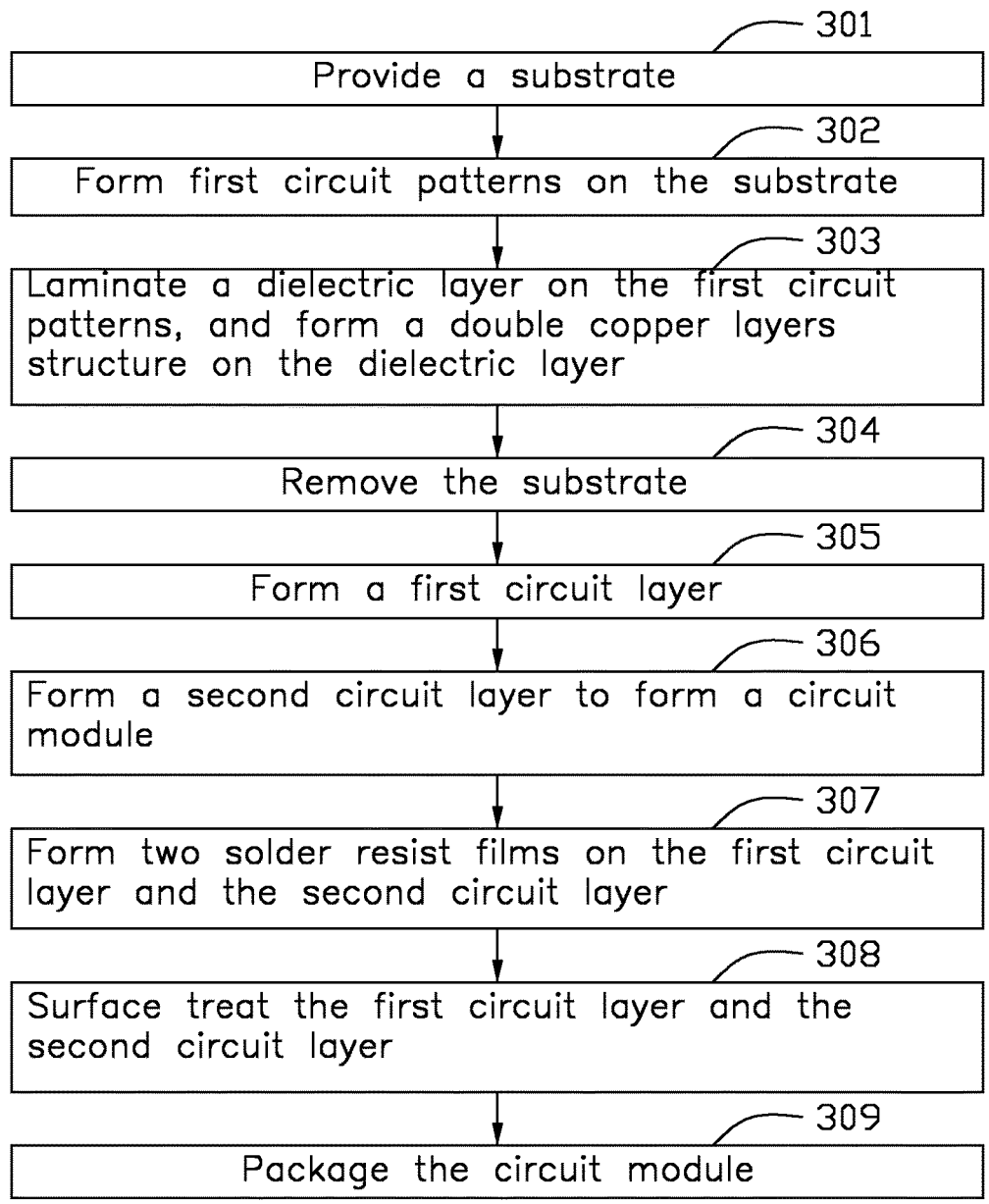
FIG. 3 is a flow chart of a method for manufacturing a package substrate of an embodiment of the present disclosure.

FIG. 3 illustrates a flowchart of an example method for manufacturing the package substrate 40. The example method is provided by way of example, as there are a variety of ways to carry out the method. The example method described below can be carried out using the configurations illustrated in FIGS. 2 and 4-16, for example, and various elements of these figures are referenced in explaining the example method. Each block shown in FIG. 3 represents one or more processes, methods or subroutines, carried out in the example method. Furthermore, the illustrated order of blocks is illustrative only and the order of the blocks can change according to the present disclosure. Additional blocks can be added or fewer blocks may be utilized, without departing from this disclosure. The example method can begin at block 301.

Figure 4:
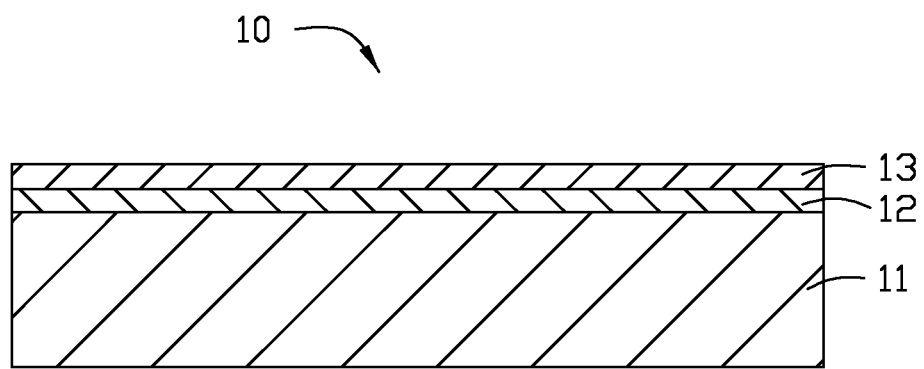
FIG. 4 is a cross sectional view of a substrate.

At block 301, referring to FIG. 4, a substrate 10 is provided. The substrate 10 can include a base 11, a copper layer 12 laminated on a top face of the base 11, and a nickel layer 13 laminated on a top surface of copper layer 12. The base 11 can be a steel plate with a thickness in a range of about 0.5 mm~10 nm. The copper layer 12 is formed on the top face of the base 11 by electroplating or other process. The copper layer 12 can have a thickness in a range of 3 μm~5 μm. The nickel layer 13 can be formed on the top surface of the copper layer 12 by electroplating or other process. The nickel layer 13 can have a thickness in a range of 0.5 μm~1.0 μm. The nickel layer 13 is configured to be a separating interface for the following process.

In at least one alternative embodiment, the base 11 of the substrate 10 is not limited to the steel plate, it also can be an aluminum plate, an iron plate or other plates, so long as the base 11 is smooth and clean.

Figure 5:
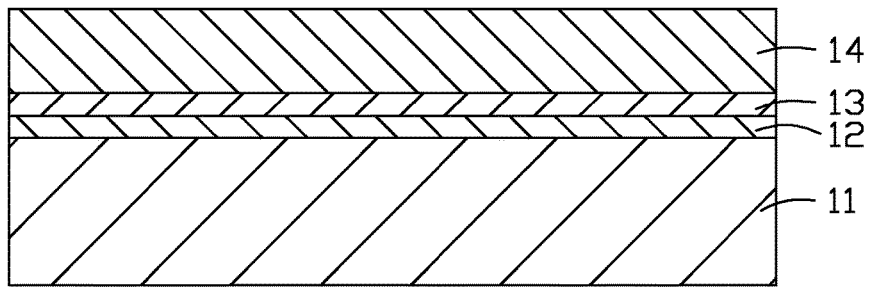
FIG. 5 is a cross sectional view of a structure of the substrate in FIG. 4 with a first copper layer.
Figure 6:
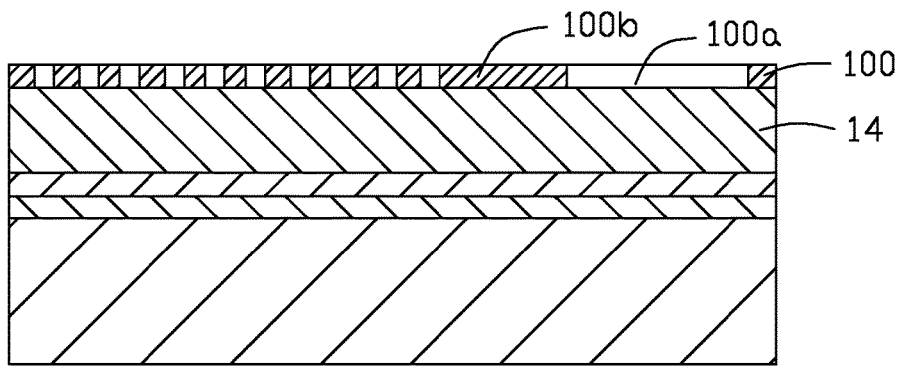
FIG. 6 is a cross sectional view of a structure in FIG. 5 with a first dry film formed on the first copper layer.
Figure 7:
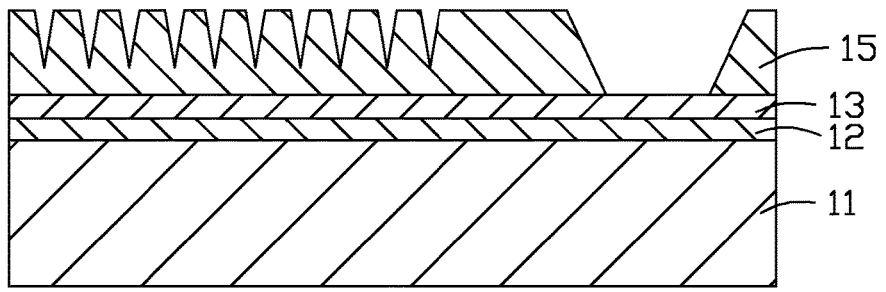
FIG. 7 is a cross sectional view of a structure in FIG. 6 with the first dry film being removed and the first copper layer being etched.

At block 302, referring to FIG. 5 through FIG. 7, a plurality of first circuit patterns 15 are formed on a top surface of the nickel layer 13 of die substrate 10. The plurality of circuit patterns 15 are formed form the first copper layer 14 by dry film etching.

A method for manufacturing the plurality of first circuit patterns 15 includes the following components.

Referring to FIG. 5, a first copper layer 14 is filmed on the substrate 10. The first copper layer 14 is formed on the top surface of the nickel layer 13 by electroplating or other process. The first copper layer 14 can have a thickness in a range of about 20 μm~30 μm.

Referring to FIG. 6, in at least one embodiment, a first dry film 100 is formed on a top surface of the copper layer 14, and is exposed to make the first dry film 100 include unexposed portions 100a and exposed portions 100b. The first dry film 100 is treated with developing and patterning.

Referring to FIG. 7, the first copper layer 14 is etched by etching solution to from a plurality of protrusions each with a cross section of trapezoid. The first dry film 100 is removed.

In at least one embodiment, portions the first copper layer 14 corresponding to the unexposed portions 100a of the first thy film 100 are etched to have preset depths, to thereby make the other portions of the first copper layer 14 form the first circuit patterns 15 each with a cross section of trapezoid. The first circuit patterns 15 are the protrusions each with the cross section of trapezoid, which forms a rudiment of a first circuit layer 16. The first circuit patterns 15 have portions thereof, adjacent to the nickel layer 13, are electrically connecting together.

Figure 8:
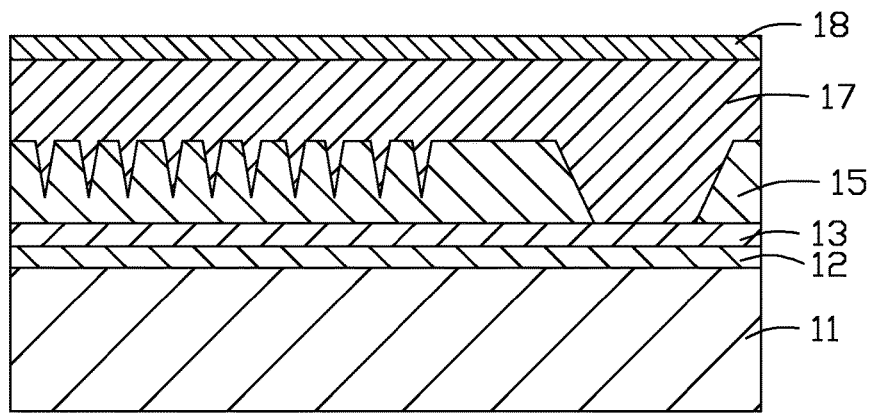
FIG. 8 is a cross sectional view of a structure in FIG. 7 and a double copper layer structure formed on the first copper layer.
Figure 9:
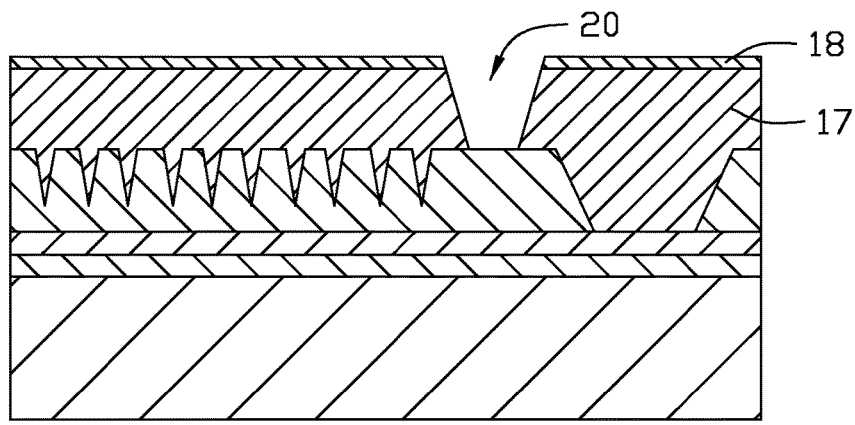
FIG. 9 is a cross sectional view of a structure in FIG. 8 with a contact hole being formed.
Figure 10:
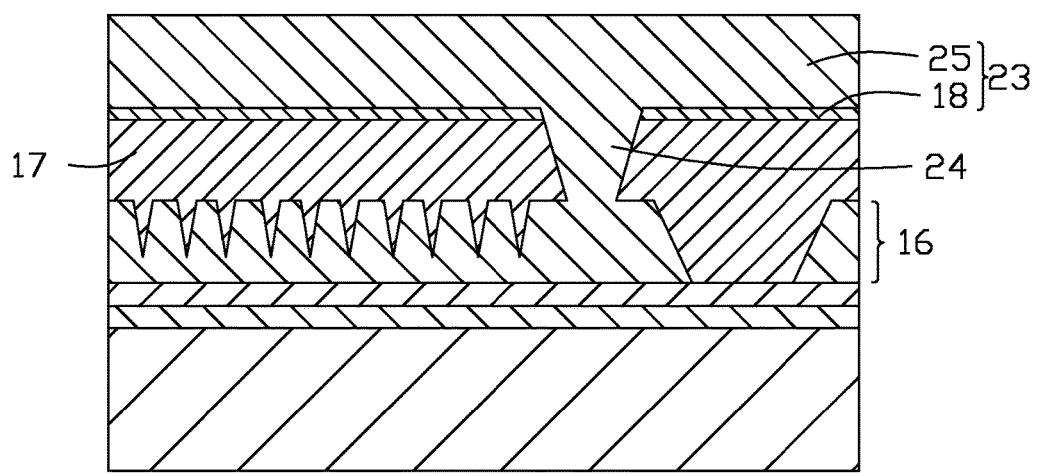
FIG. 10 is a cross sectional view of a structure in FIG. 9 with an electrically conductive pole being formed.

At block 303, referring to FIG. 8 through FIG. 10, a dielectric layer 17 is laminated on the first circuit patterns 15, to thereby embed the first circuit patterns 15 into the dielectric layer 17. A double copper layer structure is formed on the dielectric layer 17 and electrically connecting to the first circuit pattern 15.

The dielectric layer 17 includes a first side and a second side opposite to the first side. In at least one embodiment, the dielectric layer 17 coves on the first circuit patterns 15 and is filled in gaps between the first circuit patterns 15.

A method for manufacturing the double copper layer structure on the dielectric layer 17 includes the following components.

Referring to FIG. 8, a second copper layer 18 is formed on the second side of the dielectric layer 17. The second copper layer 18 is formed on the second side of the dielectric layer 17 by electroplating.

In at least one embodiment, material of the dielectric layer 17 can be epoxy resin in melt state, and has a high dielectric constant.

In at least one alternative embodiment, the second copper layer 18 is formed by chemical copper plating to form a crystal seed layer.

Referring to FIG. 9, the second copper layer 18 is half etched. A contact hole 20 is formed in the dielectric layer 17 by laser drilling. In at least one embodiment, the second copper layer 18 is half in thickness after being half etched. The contact hole 20 extends from a top face of the second copper layer 18 to one of the first circuit pattern 15. The contact hole 20 is a concave with a trapezoidal cross-section.

Referring to FIG. 10, an electrically conductive pole 24 is formed in the contact hole 20 by a process of plating through hole (PTH), simultaneously, a second copper layer 25 is formed on the second copper layer 18, to thereby form the double copper layer structure. In at least one embodiment, the electrically conductive pole 24 and the third copper layer 25 are formed by a same process.

In at least one embodiment, after the second cooper layer 18 is half etched, the second copper layer 25 is electroplating on the second copper layer 18 with a thickness in a range of about 20 μm~30 μm, and is filled in the contact bole 20 to form the electrically conductive pole 24, to thereby form the double copper layer structure.

The second copper layer 18 and the third copper layer 25 collectively form a rudiment of a second circuit layer 23.

The electrically conductive pole 24 electrically couples the third copper layer 25 to the first circuit patterns 15. In at least one embodiment, the electrically conductive pole 24 electrically couples a bottom of the third copper layer 25 to a largest one of the first circuit patterns 15.

In at least one alternative embodiment, a number of the electrically conductive pole 24 can be more according to needs.

Figure 11:
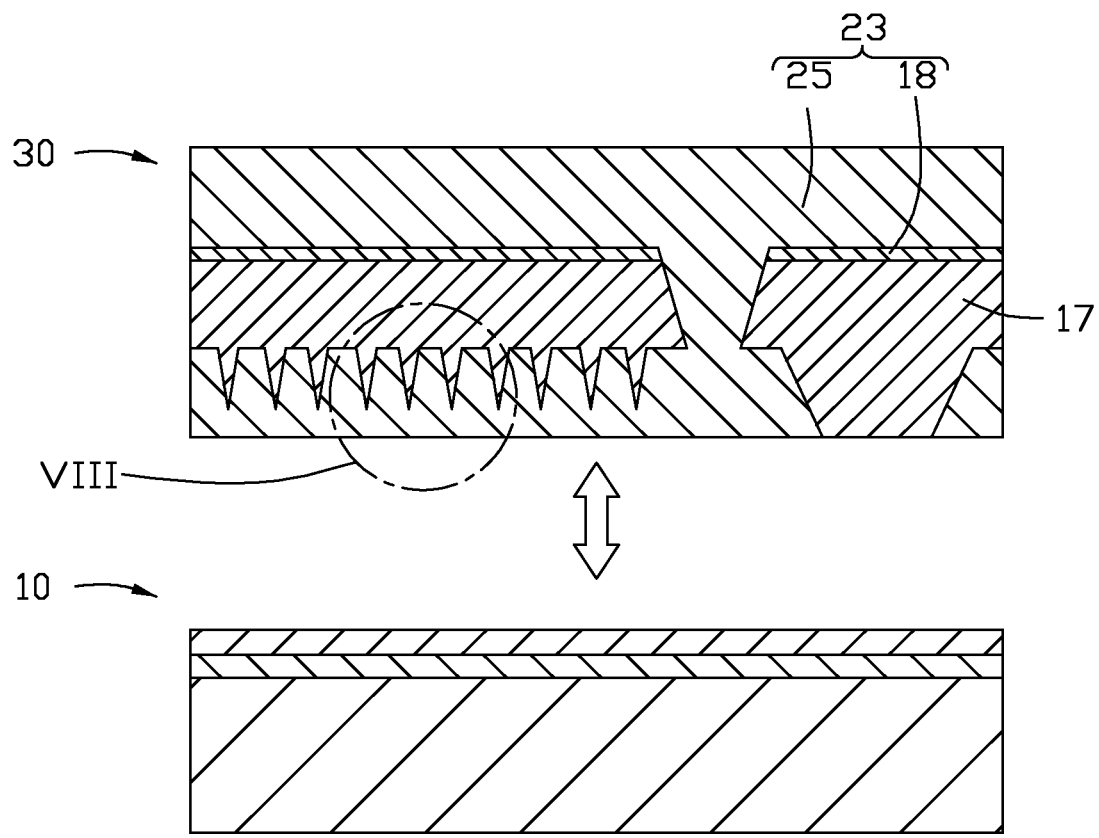
FIG. 11 is a cross sectional view of a structure in FIG. 10 with the substrate being removed.

At block 304, referring to FIG. 11, the substrate 10 is removed from the first circuit patterns 15. In at least one embodiment, the nickel layer 13 is separated from the bottom of the first circuit patterns 15 by manual depanel machine or automatic depanel machine.

Figure 12:
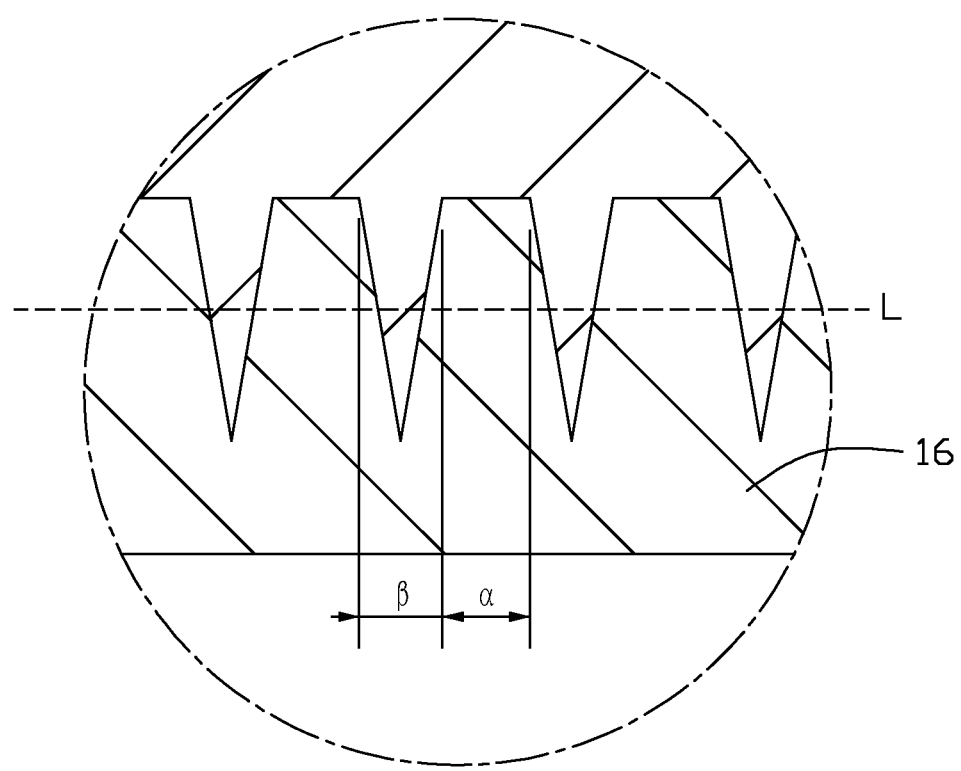
FIG. 12 is an enlarged view of a circled part VIII in FIG. 11 with line treatment for a first circuit layer.
Figure 13:
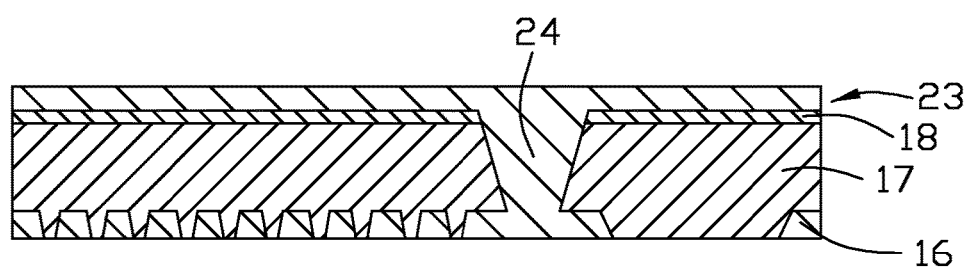
FIG. 13 is a cross sectional view of the first circuit layer and the second circuit layer after being polished.

At block 305, referring to FIG. 12 and FIG. 13, the first circuit patterns 15 are polished from faces opposite to the dielectric layer 17 to form the first circuit layer 16.

Referring to FIG. 12, in at least one embodiment, the first circuit patterns 15 are polished inwardly from the bottom faces thereof. Portions of the first circuit patterns 15 below a polishing line L are polished away, to decease a height of each of the first circuit patterns 15. A linewidth (as shown α in FIG. 12) of a circuit line defined by the first circuit pattern 15 is changed. A distance between every two adjacent circuit lines is changed. Therefore, the first circuit layer 16 is obtained to have the first circuit patterns 15 embedded in the dielectric layer 17. Each of the first, circuit patterns 15 has an extension direction from the first side toward the second side of the dielectric layer 17, and has widths thereof gradually decreasing along the extension direction.

In at least one alternative embodiment, the polishing line L can be defined any positions of the first circuit patterns 15 to form the first circuit layer 16 with different circuit lines.

Each of the circuit lines of the first circuit layer 16 is trapezoid and includes an etched face and a polished face. In at least one embodiment, each of the circuit lines of the first circuit layer 16 is consisted of electroplating copper.

The third copper layer 25 is polished from a face opposite to the second copper layer 18 toward the second copper layer 18, a thickness of the third copper layer 25 decreases to be about 10 μm-25 μm.

In at least one alternative embodiment, the third circuit layer 25 can be directly electroplating with a needed thickness at block 203, and the polishing process to the third circuit layer 25 is omitted here.

Figure 14:
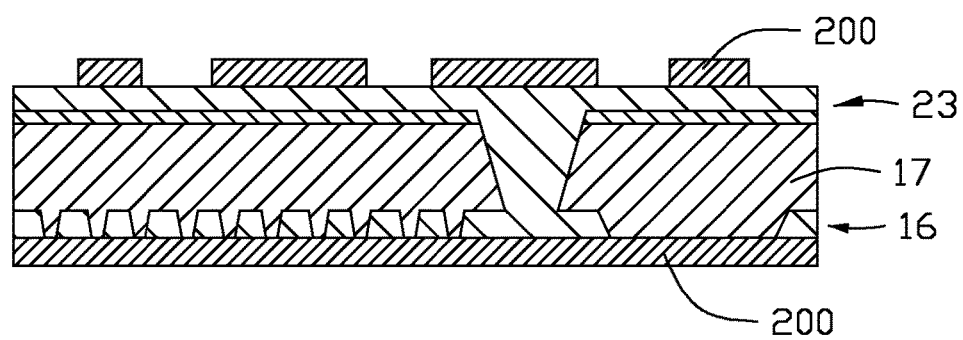
FIG. 14 and FIG. 15 are cross sectional views of a structure in FIG. 13 with the second circuit layer being etched.
Figure 15:
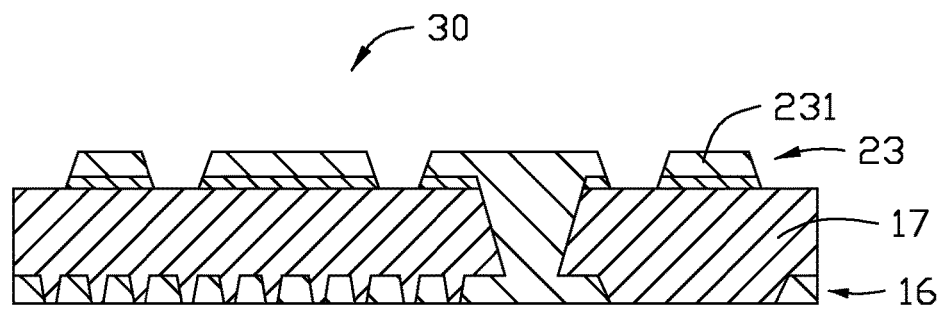

At block 306, referring to FIG. 14 and FIG. 15, the second circuit layer 23 is formed to obtain a circuit module 30. A method for manufacturing the second circuit layer 23 includes the following components.

Referring to FIG. 14, two second dry films 200 are formed on outer surfaces of the first circuit layer 16 and the third copper layer 25, respectively. The second dry film 200 on the first circuit layer 16 is entirely exposed, and is completely removed by developing. The second dry film 200 on the third copper layer 25 is partially exposed, that is to say, portions of the second dry film 200, corresponding to portions of the third copper layer 25 needing no etching, are unexposed. The second dry film 200 on the third copper layer 25 is treated with developing to form a plurality of a plurality of spaced patterns with different widths. The third cooper layer 25 and the second copper layer 18 are etched, to have portions of the third copper layer 25 and the second copper layer 18 corresponding to the patterns of the second dry film 200 being reserved, and have the other portions of the third, copper layer 25 and the second copper layer 18 being etched away, to thereby form the second circuit layer 23 with a plurality of second circuit patterns 231. The second circuit layer 23 is located outsides the dielectric layer 17.

Each of the second patterns 231 defines a circuit line. Each of the circuit lines of the second circuit layer 23 is trapezoid. In at least one embodiment, each of the circuit, lines of the second circuit layer 23 is consisted of chemical plating copper (crystal seed layer) and electroplating copper.

The circuit module 30 is formed by the first circuit layer 16, the dielectric layer 17, the electrically conductive pole 24 and the second circuit layer.

Figure 16:
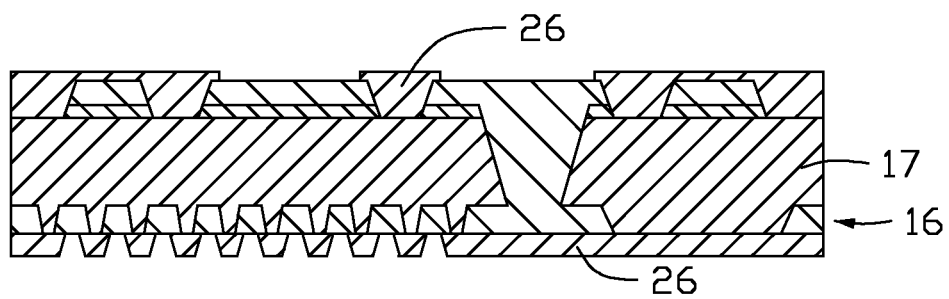
FIG. 16 is cross sectional views of a structure in FIG. 15 and two solder resist films.

At block 307, referring to FIG. 16, two solder resist films 26 are formed on outer faces of the first circuit layer 16 and the second circuit layer 23, respectively. The solder resist films 26 are exploded, developing and etched portions thereof corresponding to some of the first circuit patterns 15 of the first circuit layer 16, to forms a plurality of solder resist openings. The plurality of solder resist openings correspond to bottom faces of some of the first circuit patterns 15 one-to-one. The solder resist film 26 covers portions of an outer face of the second circuit layer 23 and is filled in gaps between the second circuit patterns 231. Each of the first circuit layer 16 and the second circuit layer 23 has portions of the outer face thereof exposed outwardly from the corresponding solder resist film 26.

At block 308, the portions of the outer faces of the first circuit layer 16 and the second circuit layer 23 exposed outwardly from the solder resist films 26 are surface treated. In at least one embodiment, the portions of the outer face of the first circuit layer 16 exposed from the corresponding solder resist film 26 are coated with organic solderability preservatives (OSP). The portions of the outer face of the second circuit layer 23 exposed from the corresponding solder resist film 26 are coated with organic solderability preservatives. The organic solderability preservatives is configured to protect the outer faces of the first circuit layer 16 and the second, circuit layer 23 form oxidation.

At block 309, referring to FIG. 1, the circuit module 30 is inversed to have the first circuit layer 16 located above the second circuit layer 23, and the circuit module 30 is packaged. A method for packaging the circuit module 30 includes the following components.

A chip 27 is provided to be electrically connecting to the first circuit layer 16. The chip 27 has a plurality of solder balls arranged at a bottom face thereof. The solder balls are received in the solder resist openings of the solder resist film 26 on the outer face of the first circuit layer 16 one-to-one, and are connecting to the bottom faces of the first circuit patterns 15 in the solder resist openings of the solder resist film 26 on the outer face of the first circuit layer 16.

A molding compound layer 28 is formed to surround the chip 27 on an outer face of solder resist film 26 on the first circuit layer 16.

A plurality of ball pads (not shown) can be connecting to the portions of the outer face of the second circuit layer 23 exposed from the corresponding solder resist film 26. The ball pads can be located out of the dielectric layer 17.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A package substrate comprising:
   a dielectric layer comprising a first side and a second side, the second side opposite to the first side;
   a first circuit layer located at the first side of the dielectric layer, and comprising a plurality of spaced first circuit patterns embedded into the dielectric layer;
   a second circuit layer located at the second side of the dielectric layer, and comprising a plurality of spaced second circuit patterns located on the second side the dielectric layer;
   at least one electrically conductive pole electrically coupling the first circuit layer to the second circuit layer; and
   a solder resist film formed on a side of the first circuit layer facing away from the dielectric layer;
   wherein each of the first circuit patterns has:
      an extension direction from the first side of the dielectric layer toward the second side of the dielectric layer; and
      widths gradually decreasing along the extension direction;
   wherein the solder resist film defines a plurality of openings, and each of the openings has a width gradually decreasing along the extension direction.

2. The package substrate of claim 1, wherein each of the first circuit patterns has a trapezoidal cross-section.

3. The package substrate of claim 2, wherein each of the second circuit patterns has a trapezoidal cross-section.

4. The package substrate of claim 1, wherein the at least one electrically conductive pole comprises a first end face and a second end face, the first end face and the second end at opposite ends of the at least one electrically conductive pole, the first end face connecting to the first circuit layer, and the second end face connecting to the second circuit layer.

5. The package substrate of claim 4, wherein:
   the first end face of the electrically conductive pole is in direct contact with the first circuit layer; and
   the second end face being in direct contact with the second circuit layer.

6. The package substrate of claim 1 further comprising another solder resist film connecting to the second circuit layer.

7. The package substrate of claim 6, wherein at least one of the second circuit patterns are exposed out of a corresponding solder resist film.

8. The package substrate of claim 6, further comprising a chip electrically connected to the first circuit layer.

9. The package substrate of claim 8, wherein the chip is connected to the first circuit patterns by a plurality of solder balls.

10. The package substrate of claim 8, further comprising a molding compound layer:
   covering the solder resist layer on the first circuit layer; and
   surrounding the chip on the first circuit layer.

* * * * *